United States Patent
Zhang et al.

(10) Patent No.: US 6,284,623 B1
(45) Date of Patent: Sep. 4, 2001

(54) METHOD OF FABRICATING SEMICONDUCTOR DEVICES USING SHALLOW TRENCH ISOLATION WITH REDUCED NARROW CHANNEL EFFECT

(76) Inventors: Peng-Fei Zhang, 5300 Shamrock Common, Fremont, CA (US) 94555; Richard A. Mann, 808 Teri Ave., Torrance, CA (US) 90503

( * ) Notice: Subject to any disclaimer, the term of this patent is extended or adjusted under 35 U.S.C. 154(b) by 0 days.

(21) Appl. No.: 09/427,407

(22) Filed: Oct. 25, 1999

(51) Int. Cl.[7] ................................................ H01L 21/76
(52) U.S. Cl. .................... 438/424; 438/425; 438/433; 438/435
(58) Field of Search ................................. 438/424, 435, 438/433, 425

(56) References Cited

U.S. PATENT DOCUMENTS

| | | | |
|---|---|---|---|
| 4,923,821 | * | 5/1990 | Namose . |
| 5,872,058 | * | 2/1999 | Van Cleemput et al. . |
| 5,960,276 | * | 9/1999 | Liaw et al. . |
| 5,989,978 | * | 11/1999 | Peidous . |
| 6,143,635 | * | 11/2000 | Boyd et al. . |
| 6,156,906 | * | 12/2000 | Bandyopadhyay et al. . |
| 6,225,187 | * | 5/2001 | Huang et al. . |
| 6,228,727 | * | 5/2001 | Lim et al. . |

OTHER PUBLICATIONS

Scott Williams, "In–Situ Nitride Mask Open," IEEE/CPMT: Twenty–Third Electronics Manufacturing Technology Symposium, Oct. 1998, pp. 146–149.*

* cited by examiner

Primary Examiner—Chandra Chaudhari
Assistant Examiner—Stephen W. Smoot
(74) Attorney, Agent, or Firm—Snell & Wilmer, L.L.P.

(57) ABSTRACT

A method of fabricating semiconductor devices, such as conductors, fuses, capacitors, diodes, transistors, and the like, includes forming or obtaining a semiconductor wafer having a substrate material, an oxide layer, and a nitride layer. Mesas (the edges of which include active regions) are then formed by etching trenches (gaps) into the substrate material through the nitride and oxide layers. In accordance with one aspect of the present invention, the nitride layer is then pulled-back or retracted from the edges of the active regions thus exposing the corners of the active regions. The gaps and the edges of the active regions are then lined with a layer of oxide which rounds the corners of the active regions. The gaps are filled with another layer of oxide, and the semiconductor wafer is then planarized. Optionally, the edges of the active regions are then implanted with dopant.

32 Claims, 5 Drawing Sheets

METHOD OF FABRICATING SEMICONDUCTOR DEVICES USING SHALLOW TRENCH ISOLATION WITH REDUCED NARROW CHANNEL EFFECT

BACKGROUND OF THE INVENTION

1. Field of the Invention

The present invention generally relates to fabricating semiconductor devices, and more particularly, to fabricating semiconductor devices using Shallow Trench Isolation ("STI") with pad nitride pull-back and transistor edge self-aligned implant to reduce reverse narrow channel effect ("RNCE").

2. Description of the Related Art

In general, semiconductor devices are manufactured or fabricated on disks of semiconductor materials called wafers or slices. More particularly, with reference to FIG. 1, a cross section of a portion of a typical semiconductor wafer 100 utilized in fabricating semiconductor devices is shown. Semiconductor wafer 100 may include a substrate layer 102, a silicon dioxide layer 104, and a nitride layer 106.

Over the years, the number of semiconductor devices which may be formed on a single semiconductor wafer 100 has continuously increased with the corresponding reduction in the size of the semiconductor devices. In fact, the fabrication of semiconductor devices with device pitch sizes (i.e., the smallest dimension of a device with isolation) at a sub-micron (i.e., less than 1 micron) and a sub-half micron scale has been made possible with the advent of Shallow Trench Isolation ("STI") techniques.

With reference to FIG. 2, a conventional STI technique may be utilized to form trenches (also known as gaps) 110 and mesas (which include active regions) 112 on a semiconductor wafer 100. More particularly, gaps 110 are etched with the nitride layer 106 of FIG. 1 as a hard mask, then filled in with an oxide layer 107 (commonly known as a field oxide layer). Semiconductor wafer 100 then undergoes chemical mechanical planarization ("CMP") to produce a smooth and planar surface. After the nitride mask is removed and wafer surface is cleaned, a very thin layer of oxide (i.e., gate oxide) is grown. A poly-silicon (also known as 'poly') layer 108 is then deposited.

Conventional STI techniques, however, produce active regions 112 with sharp corners 116 and divots 114 in the field oxide layer 107. Additionally, conventional STI techniques result in dopant loss at edges 118 of active regions 112. Consequently, semiconductor devices fabricated using conventional STI techniques typically suffer from Reverse Narrow Channel Effect ("RNCE"), which is characterized by a low threshold voltage (i.e., the voltage at which the device turns on) and a high off-current (i.e., the current at which the device turns off). In general, semiconductor devices with high off-currents are undesirable as they require more power and cannot be effectively turned off.

SUMMARY OF THE INVENTION

The present invention relates to fabricating semiconductor devices such as conductors, fuses, capacitors, diodes, transistors, and the like. In accordance with an exemplary embodiment of the present invention, a semiconductor wafer having a substrate material, an oxide layer, and a nitride layer is either formed or obtained. Mesas (the edges of which comprise active regions) are then formed by etching trenches (gaps) into the substrate material through the nitride and oxide layers. In accordance with one aspect of the present invention, the nitride layer is then pulled-back or retracted from the edges of the active regions thus exposing the corners of the active regions. The gaps and the edges of the active regions are then lined with a layer of oxide which rounds the corners of the active regions. The gaps are filled with another layer of oxide, and the semiconductor wafer is then planarized. In accordance with another aspect of the present invention, the edges of the active regions are then implanted with dopant.

BRIEF DESCRIPTION OF THE DRAWINGS

The subject matter of the present invention is particularly pointed out and distinctly claimed in the concluding portion of the specification. The present invention may best be understood, both as to organization and method of operation, by reference to the following description taken in conjunction with the claims and the accompanying drawing, in which like parts may be referred to by like numerals:

DETAILED DESCRIPTION

The subject matter of the present invention is particularly suited for use in connection with the fabrication of semiconductor devices on a semiconductor wafer. As a result, an exemplary embodiment of the present invention is described in that context. It should be recognized, however, that such description is not intended as a limitation on the use or applicability of the present invention, but is instead provided to enable a full and complete description of the exemplary embodiment.

The fabrication of semiconductor devices typically begins with a semiconductor wafer being sliced from a silicon ingot. The wafer then undergoes multiple deposition, patterning, doping, planarizing, and heat treatment processes to form various semiconductor devices, such as conductors, fuses, resistors, capacitors, diodes, transistors, and the like.

In this manner, millions of devices can be formed on a single wafer. In the following description, however, for the sake of simplicity, the fabrication of a single active region will be shown and described. It should be appreciated, however, that the present invention can be applied to the fabrication of any number and variety of semiconductor devices.

Figure 1:
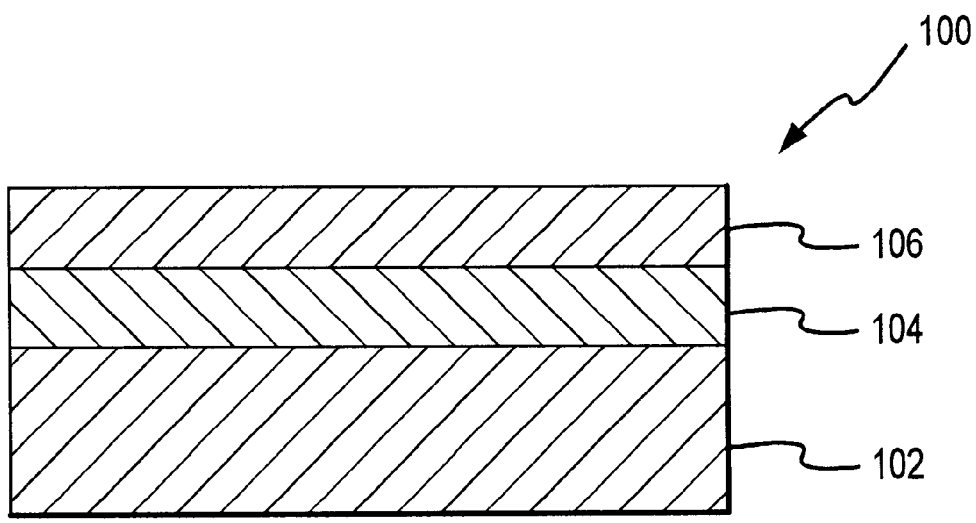
FIG. 1 is a cross section of a portion of a prior art semiconductor wafer.
Figure 2:
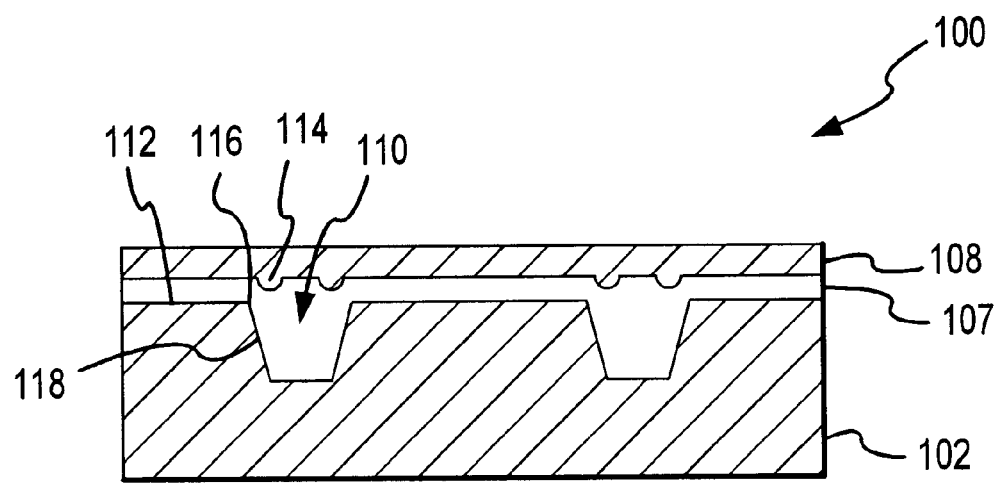
FIG. 2 is a cross section of a portion of the prior art semiconductor wafer shown in FIG. 1 after processing with gaps and active regions formed therein.
Figure 3:
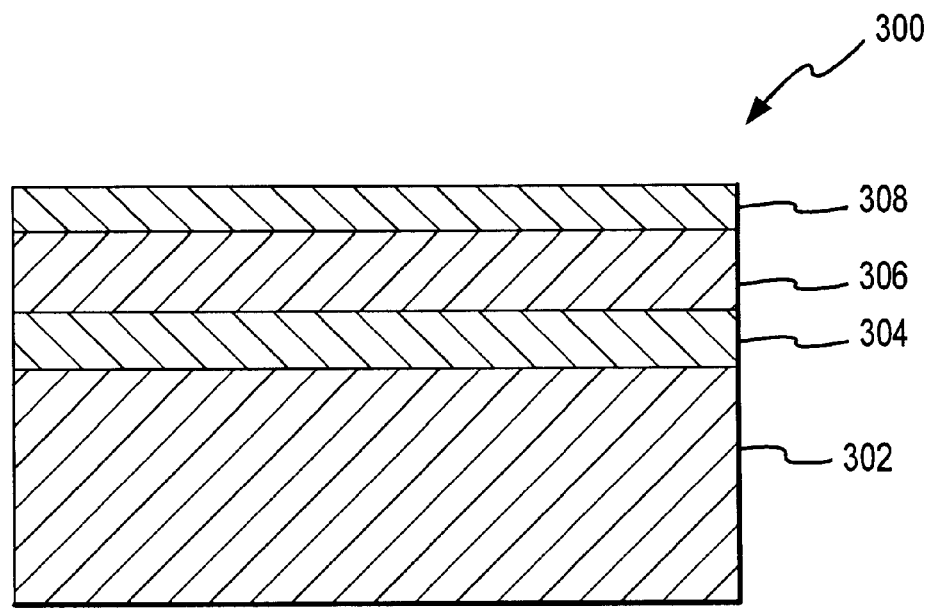
FIG. 3 is a cross section of a portion of a semiconductor wafer in accordance with various aspects of the present invention.

With reference to FIG. 3, a semiconductor wafer 300 according to various aspects of the present invention suitably includes a substrate material 302. More particularly, in an exemplary embodiment of the present invention, semiconductor wafer 300 preferably includes a P-type (100) 8 inch silicon wafer, and substrate material 302 includes silicon. It should be recognized, however, that semiconductor wafer 300 can include various types of silicon wafers, and substrate material 302 can include various semiconductor material, such as gallium arsenide and the like, depending on the particular application.

In accordance with various aspects of the present invention, a pad oxide layer 304 is suitably formed on substrate material 302, and a pad nitride layer 306 is suitably formed on pad oxide layer 304. In the present exemplary embodiment, pad oxide layer 304 is preferably about 100 Angstroms to about 150 Angstroms thick, and pad nitride layer 306 is about 1,100 Angstroms to about 2,000 Angstroms thick. It should be recognized, however, that the thickness of pad oxide layer 304 and the thickness of pad nitride layer 306 can vary depending on the particular application. Additionally, pad oxide layer 304 and pad nitride layer 306 can be formed using any convenient deposition technique, such as chemical vapor deposition, thermal growth, sputtering, and the like.

In accordance with one aspect of the present invention, a TEOS oxide layer 308 is suitably formed on pad nitride layer 306. It should be recognized, however, that any types of oxide layer such as HDP oxide, PECVD oxide, PVD oxide or the like can be used to form oxide layer 308. In the present exemplary embodiment, TEOS oxide layer 308 is about 300 Angstroms to about 500 Angstroms thick. It should be recognized, however, that the thickness of TEOS oxide layer 308 can vary depending on the particular application. Additionally, as will be more fully described below, TEOS oxide layer 308 can be omitted without deviating from the spirit and scope of the present invention.

Thus, in the manner described above, pad oxide layer 304, pad nitride layer 306, and TEOS oxide layer 308 according to various aspects of the present invention are formed on the surface of substrate material 302. It should be recognized, however, that various methods in addition to those described above can be employed to form semiconductor wafer 300. Alternatively, a semiconductor wafer can be obtained having pad oxide layer 304, pad nitride layer 306, and optional TEOS oxide layer 308 already formed on the wafer. Additionally, it should be appreciated that the specific thicknesses stated above for the various layers were to enable a full and complete description of the present exemplary embodiment, and should not be construed to limit the applicability of the present invention.

Figure 4:
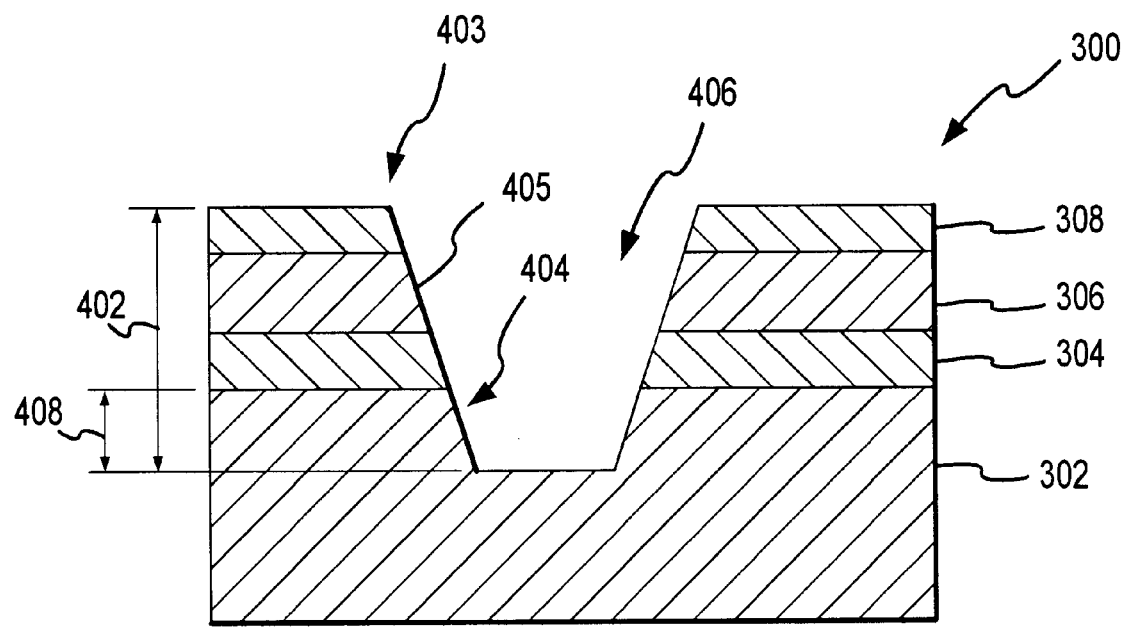
FIG. 4 is a cross section of a portion of a semiconductor wafer having gaps and active regions formed therein according to various aspects of the present invention.

After pad oxide layer 304, nitride layer 306, and TEOS oxide layer 308 are formed on substrate material 302, then, with reference to FIG. 4, trenches 406 (also known as gaps) and mesas 403 are formed using photolithography and any convenient etch methods, such as RIE, and the like. Mesas 403 have edges 405 on which active regions 404 are located. In the present exemplary embodiment, gaps 406 are formed using DUV (Deep Ultra-Violet light) lithography and Reactive Ion Etching (RIE). More particularly, gaps 406 are formed with a depth 402 of about 3000 Angstroms to about 4000 Angstroms. Gaps 406 extend into the surface of the substrate material 302 to form a active region height 408 of about 2500 Angstroms to about 3500 Angstroms. It should be appreciated, however, that depth 402 of gaps 406 can vary depending on the particular application. For example, in an alternative configuration of the present exemplary embodiment in which the TEOS oxide layer 308 is omitted, depth 402 of gaps 406 would be about 2500 Angstroms to about 3700 Angstroms, and the active region height 408 would remain about 2500 Angstroms to about 3500 Angstroms.

Figure 5:
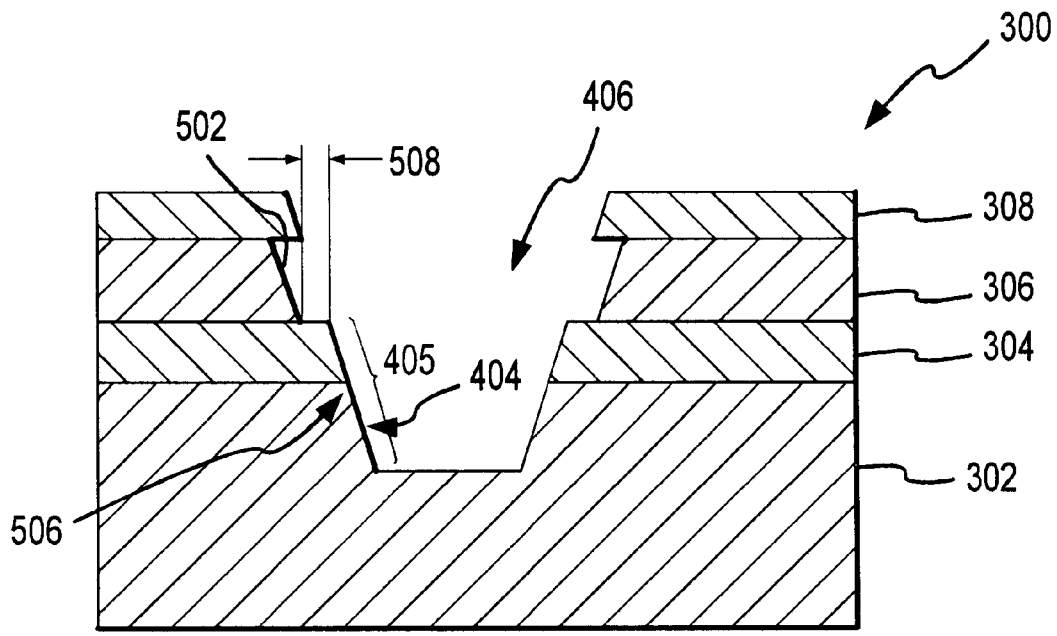
FIG. 5 is a cross section of a portion of a semiconductor wafer having a layer of the semiconductor wafer retracted according to various aspects of the present invention.

With reference to FIG. 5, sidewalls 502 of nitride layer 306 according to various aspects of the present invention are pulled-back or retracted from edges 405 above active region 404 to expose upper corners 506 (which are better shown in FIG. 6) of active region 404 using any convenient etching method. In the present exemplary embodiment, sidewalls 502 of nitride layer 306 are pulled back by immersion in a hot phosphoric acid bath. The temperature of the solution is about 100 C. and the immersion time is around 60 minutes. The phosphoric acid etches nitride layer 306 without etching substrate material 302, pad oxide layer 304, or TEOS oxide layer 308. Additionally, by controlling the immersion time, the amount of sidewall 502 nitride layer 306 which is retracted (defined by width 508) can be controlled. In the present exemplary embodiment, sidewalls 502 of nitride layer 306 are retracted a width 508 of about 250 Angstroms to about 500 Angstroms. Additionally, TEOS oxide layer 308 facilitates a more controlled retraction of nitride layer 306 as only the sidewalls 502 of nitride layer 306 are preferably exposed to the phosphoric acid. As previously indicated, it should be recognized, however, that nitride layer 306 can be retracted according to various aspects of the present invention without the presence of TEOS oxide layer 308. Furthermore, as will be described in greater detail below, the amount of nitride layer 306 which is retracted from sidewalls 502 can vary depending on the particular application.

Figure 6:
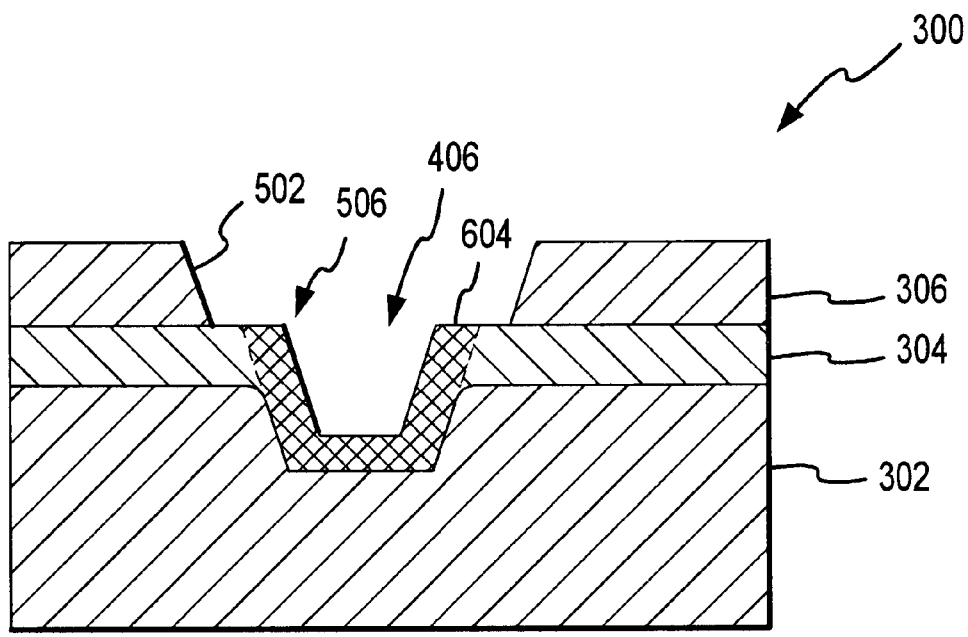
FIG. 6 is a cross section of a portion of a semiconductor wafer having a gap lined with a layer of oxide according to various aspects of the present invention.

After the nitride layer 306 is retracted, TEOS oxide layer 308 is preferably removed using any convenient etch method, such as RIE or diluted HF immersion. With reference to FIG. 6, a liner oxide layer 604 (shown as cross-hatched) according to various aspects of the present invention is suitably formed in gap 406 using any convenient oxidation process. In the present exemplary embodiment, liner oxide layer 604 is preferably formed using a thermal oxidation process. Liner oxide layer 604 is formed such that it is essentially contiguous with pad oxide layer 304. In addition to forming liner oxide layer 604, the thermal oxidation process removes silicon from substrate material 302 when substrate material 302 includes silicon. More particularly, the removal of silicon from corners 506 of active regions 404 results in the rounding of corners 506. In conventional fabrication processes in which active faces 502 of nitride layer 306 are not retracted, only a small amount of rounding of corners 506 occurs. For example, in a conventional fabrication process, corners 506 may typically be rounded with a radius of about 20~30 nanometers. In the present exemplary embodiment, however, as the nitride layer 502 is pulled back to expose more of corners 506, the thermal oxidation process results in a greater amount of rounding of corners 506. For example, when nitride layer 306 is retracted about 250 Angstroms to 500 Angstroms, then corners 506 can be rounded with a radius of about 50~100 nanometers. It should be recognized, however, that the extent of rounding can be controlled in part by the amount of retraction of nitride layer 306. As previously indicated, the rounding of corners 506 reduces reverse narrow channel effect ("RNCE"). More particularly, the rounding of corners 506 reduces the effect of fringing field concentration at corners 506, thus reducing RNCE.

Figure 7:
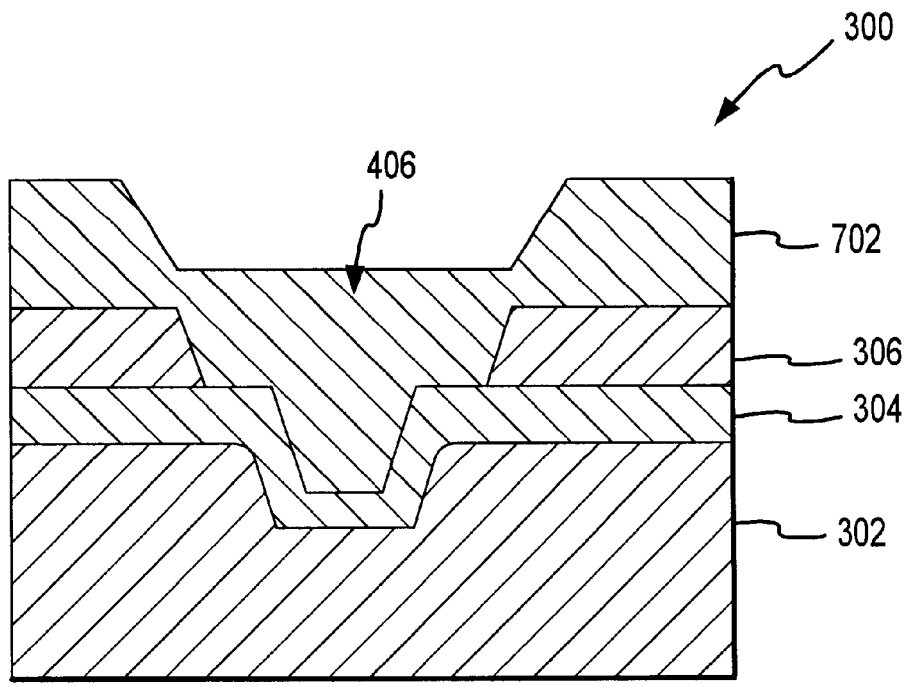
FIG. 7 is a cross section of a portion of a semiconductor wafer having a gap filled with a layer of oxide according to various aspects of the present invention.

Next, with reference to FIG. 7, the gaps 406 are suitably filled with oxide layer 702 using high density plasma oxide deposition. It should be recognized, however, that various suitable deposition processes can be used to fill gaps 406 depending on the particular application. Semiconductor wafer 300 is then suitably planarized using any convenient planarizing process, such as chemical-mechanical polishing, lapping, grinding, honing, slurry polishing, and the like.

Figure 8:
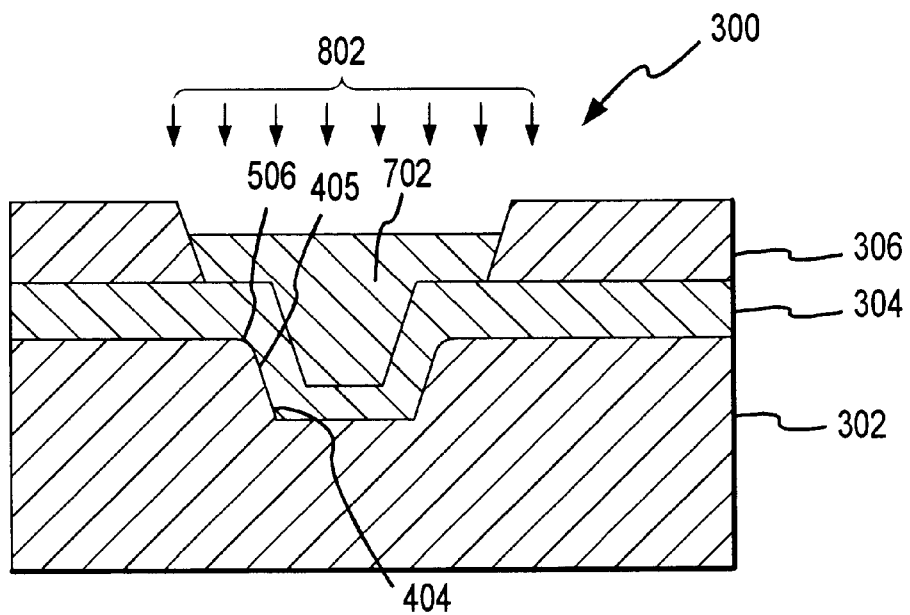
FIG. 8 is a cross section of a portion of a semiconductor wafer having a dopant implanted according to various aspects of the present invention.

After planarization, with reference to FIG. 8, doped regions are suitably formed in semiconductor wafer 300 using any conventional doping process. In the present exemplary embodiment, an ion implant process (transistor edge-aligned implant) is preferably utilized to implant a dopant 802 at about 15 kilo electron-volts (KeV) to about 250 KeV. Dopant 802 are Boron ions to form a NMOS device and Phosphorous or Arsenic ions to form a PMOS device. After nitride layer 306 according to various aspects of the present invention has been retracted, dopant 802 can be implanted into edges 405 of active region 404 and particularly into corners 506 by employing an NMOS S/D implant mask to avoid exposing the middle of active regions 404 to dopant 802. In this manner, the appropriate level of dopant 802 can be implanted to compensate for loss of impurity at later process steps from edges 405 of active region 404. As the loss of impurity from edges 405 of active region 404 can enhance RNCE, the implantation of dopant into edges 405 of active region 404 can thus reduce RNCE.

Figure 9:
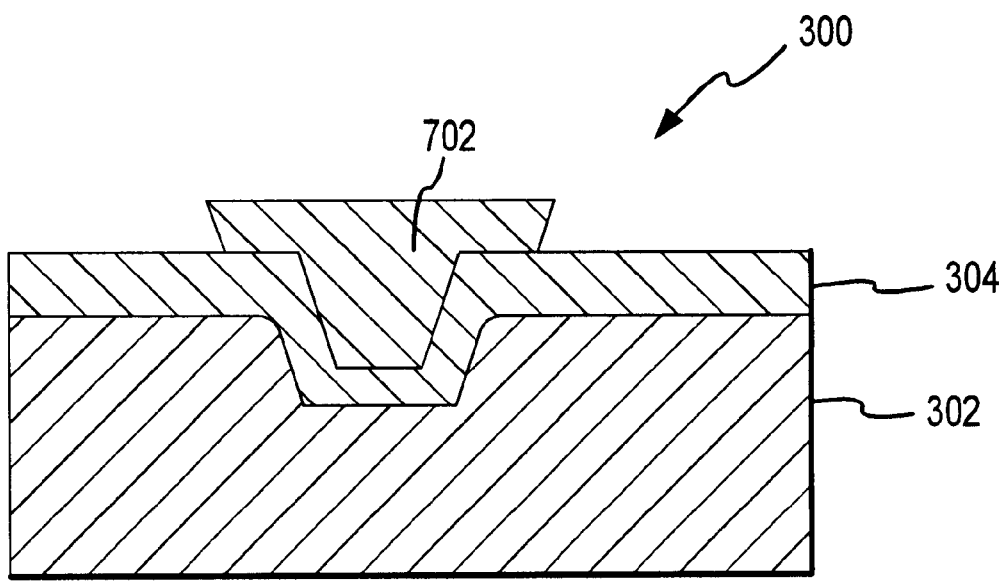
FIG. 9 is a cross section of a portion of a semiconductor wafer having the nitride layer removed according to various aspects of the present invention.
Figure 10:
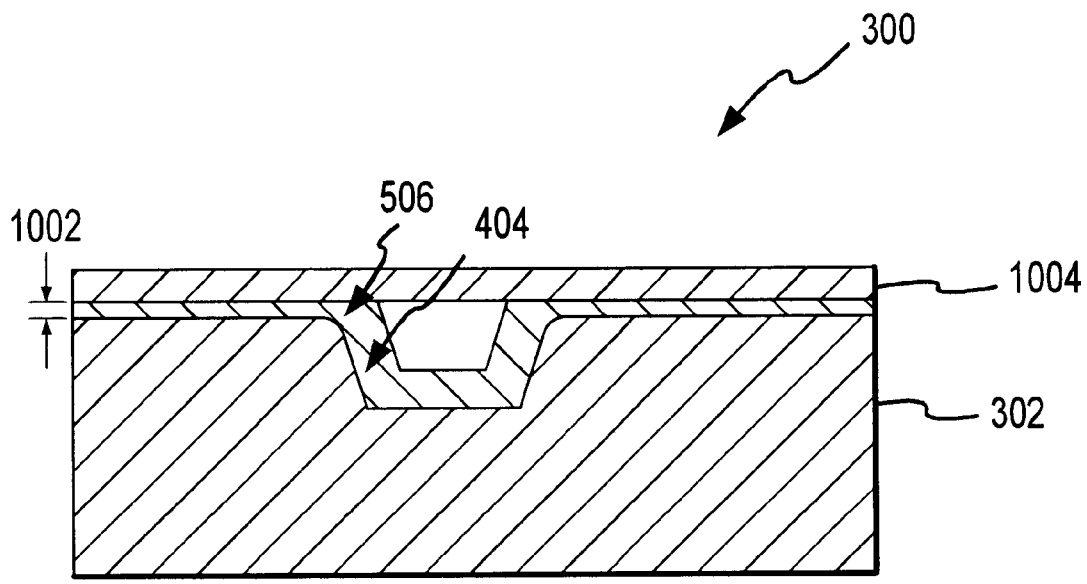
FIG. 10 is a cross section of a portion of a semiconductor wafer having a layer of polysilicon deposited according to various aspects of the present invention.

With reference to FIG. 9, nitride layer 306 is then removed using any convenient method, such as immersion in a phosphoric acid bath, and the like. With reference to FIG. 10, semiconductor wafer 300 is suitably etched or planarized to produce an active region oxide thickness 1002 of about 35 Angstroms. It should be recognized, however, that active region oxide thickness 1002 can vary depending on the particular application. A polysilicon layer 1004 is then suitably deposited using any convenient polysilicon deposition process. As depicted in FIG. 10, the rounding of corner 506 resulting from the retraction of nitride layer 306 described above produces a polysilicon layer 1004 without local recesses (also known as divots). Consequently, active region 404 is less susceptible to fringing fields, thereby reducing RNCE and facilitating the fabrication of semiconductor devices with lower off-currents than devices fabricated using conventional methods. In addition to reducing RNCE, the ability to control the amount of nitride pull-back, as described above, produces devices with less variation in threshold voltage and off-current.

While preferred embodiments of the present invention have been shown in the drawings and described above, it will be apparent to one skilled in the art that various embodiments of the present invention are possible. For example, the specific dimensions and parameters described herein are associated with one exemplary embodiment. Any suitable dimensions and parameters may be utilized depending upon the particular application. Therefore, the present invention should not be construed as limited to the specific form shown and described above.

What is claimed is:

1. A method of fabricating a semiconductor device on a wafer having a layer of substrate material, a first layer of oxide on top of the layer of substrate material, and a layer of nitride on top of the layer of oxide, said method comprising the steps of:

etching a plurality of trenches through the layer of nitride and the first layer of oxide and into the layer of substrate material to form mesas between said trenches, wherein said mesas have edges;

retracting the layer of nitride from the edges of said mesas; and after said retracting, forming a second layer of oxide on the edges of the mesas.

2. The method of claim 1, wherein said etching step further comprises the step of masking the trenches using DUV lithography; and wherein the trenches are etched using reactive ion etching.

3. The method of claim 1, wherein said plurality of trenches extends between about 2500 Angstroms and about 3500 Angstroms into the layer of substrate material.

4. The method of claim 3, wherein the layer of substrate material comprises silicon.

5. The method of claim 1, wherein said retracting step comprises the step of immersing the wafer in a hot phosphoric acid bath.

6. The method of claim 1, wherein said retracting step retracts the layer of nitride to between about 250 Angstroms and 500 Angstroms from the edges of the mesas.

7. The method of claim 1, wherein said forming step comprises the step of forming the second layer of oxide using a thermal oxidation process.

8. The method of claim 1, further comprising the steps of:

filling the trenches with a third layer of oxide;

planarizing the wafer; and implanting a dopant into the edges of the mesas.

9. The method of claim 8, wherein said filling step comprises depositing high density plasma oxide.

10. The method of claim 8, wherein said planarizing step comprises chemical mechanical planarization.

11. The method of claim 8, wherein said implanting step comprises ion implantation at between about 15 kilo electron-volts and about 250 kilo electron-volts.

12. The method of claim 8, wherein said dopant comprises Boron ions.

13. The method of claim 8, wherein said dopant comprises Phosphorous ions.

14. The method of claim 1, further comprising the step of depositing a third layer of oxide on top of the layer of nitride prior to said etching step.

15. The method of claim 14, wherein said third layer of oxide comprises TEOS oxide.

16. The method of claim 14, wherein said etching step etches said plurality of trenches through said third layer of oxide.

17. The method of claim 16, further comprising the step of removing said third layer of oxide following said retracting step and prior to said depositing step.

18. A method of fabricating a semiconductor device using a semiconductor wafer having a substrate material layer, said method comprising the steps of:

depositing a pad oxide layer on top of said substrate material layer;

depositing a pad nitride layer on top of said pad oxide layer;

etching a plurality of trenches through said pad nitride layer and said pad oxide layer and into said substrate material layer to form mesas between said trenches, wherein said mesas have edges;

retracting said pad nitride layer from the edges of said mesas; and after said retracting, depositing a liner oxide layer on the edges of said mesas.

19. The method of claim 18, wherein said wafer comprises a P-type silicon wafer and said substrate material layer comprises silicon.

20. The method of claim 18, wherein said pad oxide layer is between about 100 Angstroms and about 150 Angstroms in thickness.

21. The method of claim 18, wherein said pad nitride layer is between about 1,100 Angstroms and about 2,000 Angstroms in thickness.

22. The method of claim 18, wherein said plurality of trenches extends between about 2500 Angstroms and about 3500 Angstroms into the layer of substrate material.

23. The method of claim 18, wherein said step of depositing rounds the corners of the layer of substrate material of the mesas such that the radii of the corners is about 50 nanometers to about 100 nanometers.

24. The method of claim 18, further comprising the steps of:
    depositing a filler oxide layer to fill-in said trenches;
    planarizing the wafer; and
    implanting a dopant into the edges of the mesas.

25. The method of claim 24, wherein said retracting step retracts said pad nitride layer to between about 250 Angstroms and 500 Angstroms from the edges of the mesas.

26. The method of claim 24, wherein said implanting step comprises ion implanting at between about 15 kilo electron-volts and about 250 kilo electron-volts.

27. The method of claim 24, further comprising the step of depositing a TEOS oxide layer on top of said pad nitride layer prior to said etching step.

28. The method of claim 27, wherein said TEOS oxide layer is between about 300 Angstroms and about 500 Angstroms in thickness.

29. The method of claim 27, further comprising the step of removing said TEOS oxide layer following said retracting step.

30. A method of fabricating a semiconductor device using a semiconductor wafer having a substrate material layer, said method comprising the steps of:
    depositing a pad oxide layer on top of said substrate material layer;
    depositing a pad nitride layer on top of said pad oxide layer;
    etching a plurality of trenches through said pad nitride layer and said pad oxide layer and into said substrate material layer to form mesas between said trenches, wherein said mesas have edges;
    retracting said pad nitride layer from the edges of said mesas;
    after said retracting, depositing a liner oxide layer on the edges of said mesas;
    depositing a filler oxide layer to fill in said trenches;
    planarizing the wafer; and
    implanting a dopant into the edges of the mesas.

31. The method of claim 30, further comprising the step of depositing a TEOS oxide layer on top of said pad nitride layer prior to said etching step.

32. The method of claim 31, further comprising the step of removing said TEOS oxide layer following said retracting step.

* * * * *